US007519514B2

(12) United States Patent
Roushall

(10) Patent No.: US 7,519,514 B2
(45) Date of Patent: Apr. 14, 2009

(54) SYSTEMS AND METHODS FOR REMOVING NOISE FROM SPECTRAL DATA

(75) Inventor: Randy Keith Roushall, Redwood City, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 70 days.

(21) Appl. No.: 11/457,751

(22) Filed: Jul. 14, 2006

(65) Prior Publication Data

US 2008/0015821 A1 Jan. 17, 2008

(51) Int. Cl.
*G06F 15/00* (2006.01)
*H03F 1/26* (2006.01)
*H04B 15/00* (2006.01)

(52) U.S. Cl. ........................ 702/191; 702/193; 250/282

(58) Field of Classification Search ................. 702/191, 702/193; 250/282
See application file for complete search history.

(56) References Cited

U.S. PATENT DOCUMENTS

| | | | | |
|---|---|---|---|---|
| 5,300,771 | A * | 4/1994 | Labowsky | 250/282 |
| 5,393,982 | A * | 2/1995 | Mott et al. | 250/370.06 |
| 5,995,989 | A * | 11/1999 | Gedcke et al. | 708/300 |
| 6,061,641 | A * | 5/2000 | Hahn et al. | 702/85 |
| 6,306,607 | B2 * | 10/2001 | Williams | 435/6 |
| 6,333,501 | B1 * | 12/2001 | Labrenz | 250/341.5 |
| 6,787,761 | B2 * | 9/2004 | Hastings | 250/282 |
| 6,806,721 | B2 * | 10/2004 | Kant | 324/606 |
| 2003/0078739 | A1 * | 4/2003 | Norton et al. | 702/22 |
| 2003/0129760 | A1 * | 7/2003 | Aguilera et al. | 436/86 |

* cited by examiner

*Primary Examiner*—Eliseo Ramos Feliciano
*Assistant Examiner*—Janet L Suglo

(57) ABSTRACT

Systems and methods for reducing noise in spectral data. A noise burst level is defined. If a spectral point has an intensity greater than the burst level (a burst point), points neighboring the burst point are examined. If a function of these neighboring points indicates that the burst point is a discrete event, then the abundance level of the burst point is altered.

29 Claims, 13 Drawing Sheets

SYSTEMS AND METHODS FOR REMOVING NOISE FROM SPECTRAL DATA

BACKGROUND OF THE INVENTION

The present invention relates generally to reducing noise in data, and more particularly to reducing noise in a spectroscopy data, such as spectra obtained from a mass spectrometer.

In a spectrometer, a data signal typically includes a useful signal component and a noise component. The "useful signal" is typically the data of interest. The "noise" can be characterized as any component not part of the signal of interest. One goal of any spectrometer is to be able to differentiate between the "signal" and the "noise" so that the signal can be qualified as "real" and useable. However, this goal can be hard to achieve as the noise can also hide important real signals.

For example, FIG. 1A shows a chromatogram 100 for a typical ion extraction of a particular compound where the signal and the noise are measured. FIG. 1B shows a chromatogram 150 having a magnified view of chromatogram 100. The noise 120 is shown with a bracket and two of the signals 110 are shown with arrows. FIG. 1B shows that the noise levels are an order of magnitude less than these two signals 110; however, the noise levels are still comparable to other useful signals. Also, given the size of the noise, it is possible that signals are hidden within the noise. Thus, if an atomic or molecular ion makes up a small percentage of the fragments of a compound, its existence could be lost and the true make-up of the compound could be lost.

It is clear that a spectrometer performs better if it can better differentiate between signal and noise. One measure of the performance of an instrument is a signal to noise (S/N) ratio, where a larger S/N means better performance. This ratio will improve if the signal is increased or if the noise is decreased. A greater S/N ratio allows better differentiation between signals and the noise, thus allowing a greater sensitivity for detecting ions. Other measures of performance are an improvement in the MDL (Minimum Detection Limit) or LLOD (Lower Level of Detection), where an improvement results in a lower level or limit.

Accordingly, it is desirable to provide systems and methods for improving performance of a spectrometer by reducing noise in spectral data.

BRIEF SUMMARY OF THE INVENTION

The present invention provides systems and methods for reducing the noise in spectral data from a spectrometer. According to one aspect, neutral noise is removed by detecting discrete noise events in spectral data scans, each scan including a plurality of spectral data points. If a spectral point in a scan has an abundance (e.g., intensity) value greater than a predetermined burst level threshold, that point is identified as a burst point. Points neighboring a burst point in the same scan and/or in neighboring scans are examined to determine whether the burst point should be characterized as a discrete noise event. If a function of these neighboring points indicates that the burst point is a discrete event, the abundance level of the burst point is then altered or removed. Accordingly, better performance related to a lower noise floor, such as the MDL (Minimum Detection Limit) and LLOD (Lower Level of Detection), or related to an increase in the ratio of signal to noise (S/N) is achieved.

According to one aspect of the present invention, a computer-implemented method is provided for reducing noise in spectral data from a spectrometer. The method typically includes receiving one or more scans of spectral data from a spectrometer, wherein a scan is composed of a plurality of spectral data points each having an abundance value, defining a noise burst level, and processing the one or more scans to determine one or more burst points, wherein a burst point is a spectral point having an abundance value that is greater than the noise burst level. The method also typically includes evaluating a first function of a first set of one or more spectral points neighboring a first burst point, and altering the abundance value of the first burst point if the first function indicates that the first burst point is a discrete noise event. In one aspect, the first function tests whether a specified amount of the spectral points of the first set have an abundance value less than the noise burst level. The amount may be a number, a percentage, or other value. In another aspect, the first function tests whether an average of the spectral points of the set is above or below a threshold level. All of the spectral points of a set may be from the same scan as the first burst point, or each point may be from a different scan. In the latter case, each point may have the same spectral unit. For example, all of the spectral points of one set may be from the same scan as the first burst point, and each spectral point of the other set may be from a different scan. In another embodiment, a set of spectral points includes points from the same scan as the first burst point and spectral points from other scans.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings.

DETAILED DESCRIPTION OF THE INVENTION

General

The present invention provides systems and methods for reducing or removing noise in data signals from a spectrometer instrument, particularly neutral noise in data signals from a mass spectrometer. Aspects of the present invention advantageously improve the sensitivity of the spectrometer instrument by lowering the overall detection limit and/or by improving the signal-to-noise ratio.

Figure 2:
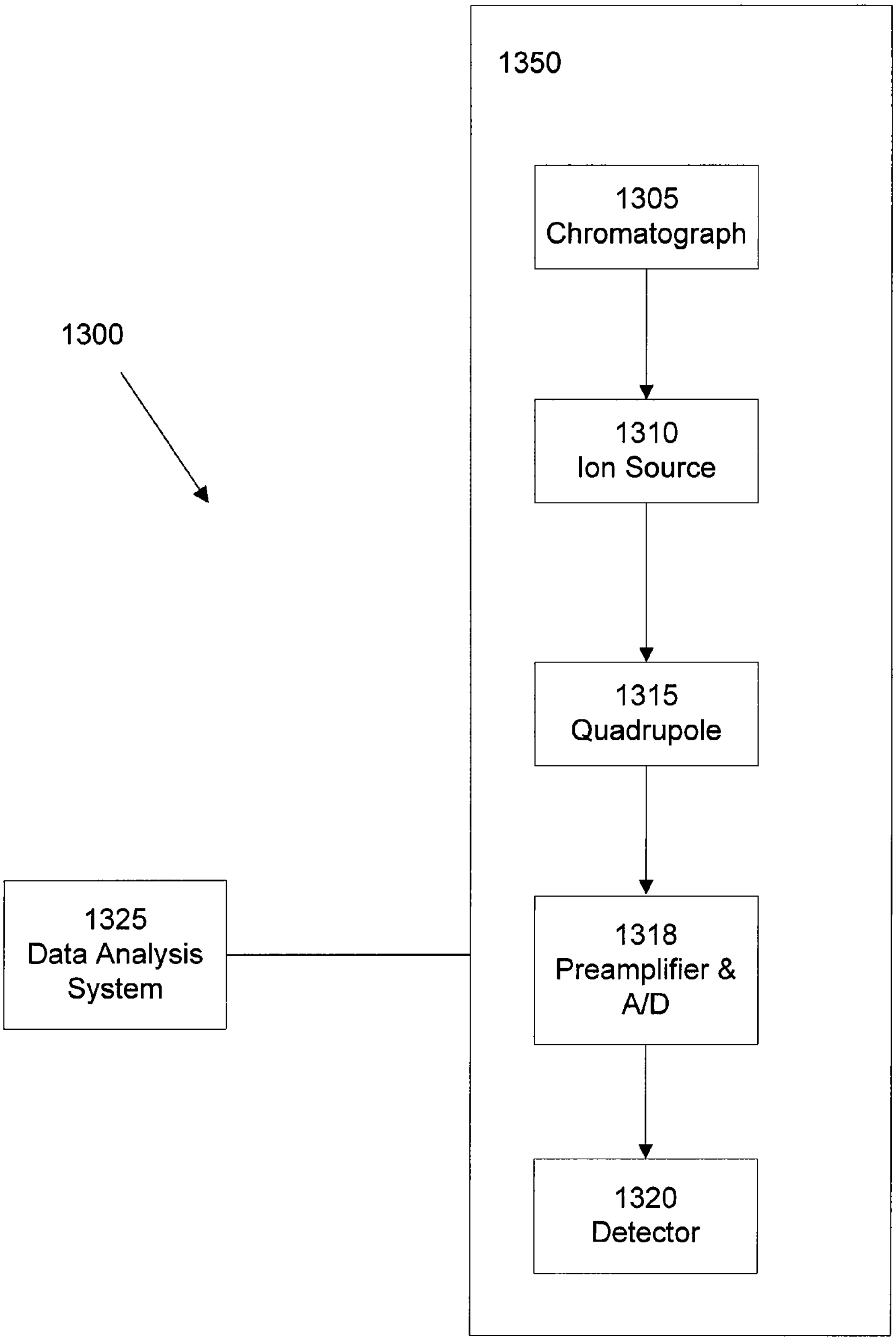
FIG. 2 illustrates a mass spectrometry system according to an embodiment of the present invention.

FIG. 2 shows a mass spectrometer system 1300 according to an embodiment of the present invention. Mass spectrometer system 1300 includes a mass spectrometer device 1350 and a data analysis system 1325. In one aspect, the mass spectrometer device 1350 includes a chromatograph 1305, an ion source 1310, a mass separation portion, e.g., quadrupole, 1315, and a detector 1320. It should be appreciated that mass spectrometer device 1350 may be any type of spectrometer, such as an electromagnetic spectrometer. Additionally, it should be understood that aspects and embodiments of the present invention are applicable to gas phase mass spectroscopy (GCMS), liquid phase mass spectroscopy (LCMS), inductively coupled plasma mass spectroscopy (ICPMS), and other spectroscopy technologies where there are unique responses to the noise characteristics of the data versus the signal of interest. The teachings of the present invention are also applicable to all types of sources, such as electron ionization (EI), chemical ionization (CI), atmospheric pressure chemical ionization (APCI), electrospray ionization (ESI), atmospheric pressure photoionization (APPI), which are commonly used in mass spectrometers. The teachings of the present invention also may be used for different types of mass spectrometers (single Quad, multiQuad, IonTrap, etc.), as well as different types of spectrometers. Although mass is referred to as a property that allows particles to be differentiated, other properties such as wavelength or cross-section may be used.

Data analysis system 1325 may include a stand alone computer system and/or an integrated intelligence module, such as a microprocessor, and associated data storage devices and systems and interface circuitry for interfacing with the various systems of mass spectrometer device 1350 as would be apparent to one skilled in the art. For example, data analysis system 1325 preferably includes interface circuitry for providing control signals to the chromatograph 1305, ion source 1310, quadrupole 1315, preamplifier and A/D 1318, and detector 1320. Data analysis system 1325 may provide real time data analysis of spectra from the mass spectrometer device 1350, i.e. analyze and reduce the noise in data before it is sent to or displayed to a user, or sent to another system, and while data acquisition is occurring. Data analysis system 1325 may also provide noise reduction after all of the data has been acquired, and after the raw data is made available to a user or other system.

As will be discussed in more detail below, the noise reduction methods of the present invention implement a bursting technique that compares neighbors, which can occur in the mass domain and/or time domain, of a single event above a burst level. If a spectral point in a scan has an intensity greater than a predetermined burst level threshold, that point is identified as a burst point. Points neighboring a burst point in the same scan and/or in neighboring scans are examined to determine whether the burst point should be characterized as a discrete noise event. If a function of these neighboring points indicates that the burst point is a discrete event, the abundance level of the burst point is then altered or removed. The burst level threshold and the neighbor settings (e.g., number of neighbors) are adjustable, either manually or automatically, e.g., based on operational settings or parameters of the instrument such as scan speed/bandwidth and detector gain, which may affect the performance of the technique.

Sources of Noise

Figure 3:
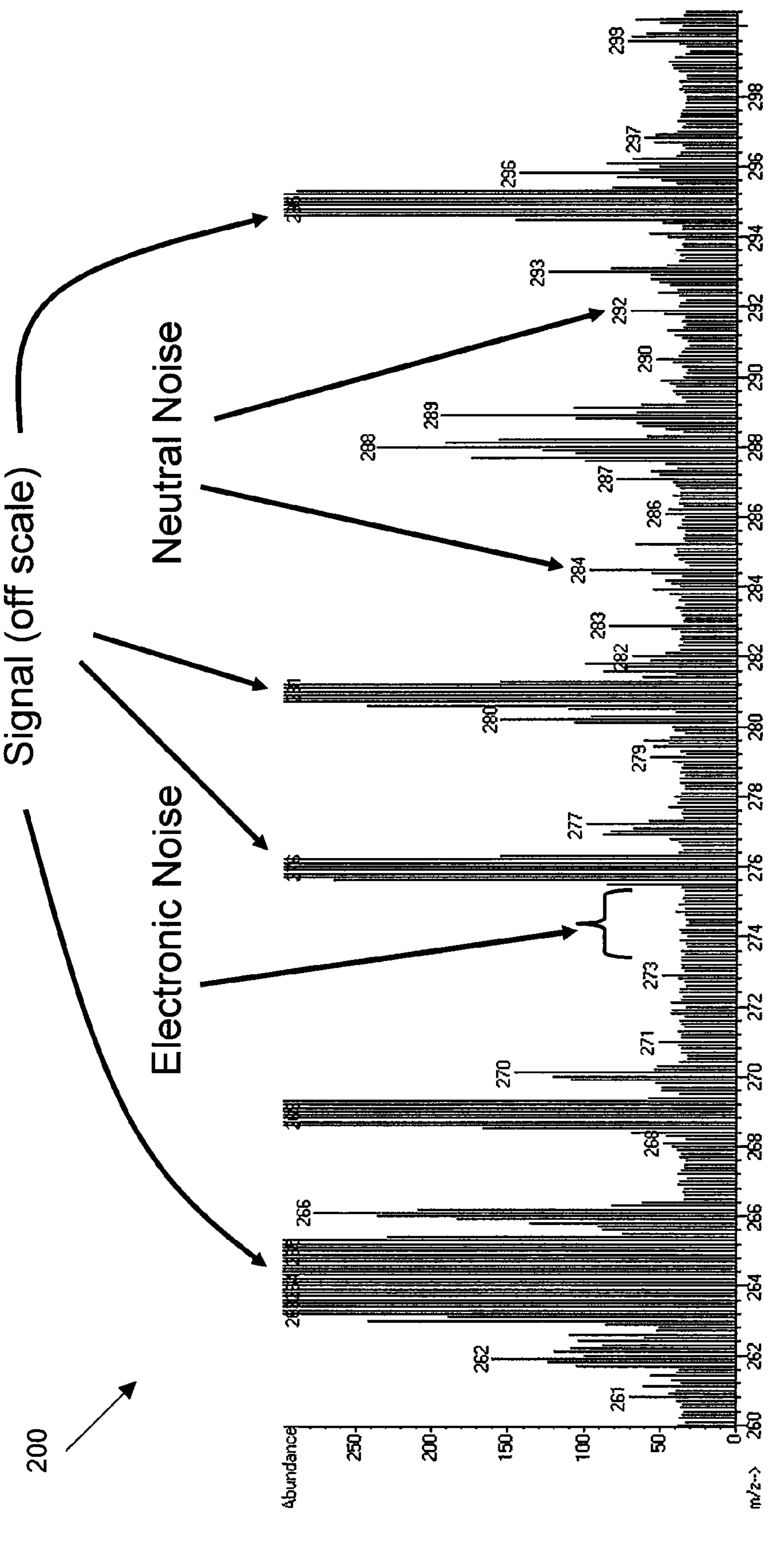
FIG. 3 illustrates a mass spectrum depicting electronic noise, neutral noise, and signals.

In a mass spectrometer, noise can be categorized as electronic, chemical, or neutral. FIG. 3 shows a graph 200 of a typical raw scan of data from a GCMS system that exhibits electronic and neutral noise. Abundance is shown on the vertical axis and the mass-to-charge ratio (m/z) is shown on the horizontal axis. Graph 200 is magnified toward the bottom of the abundance scale to focus on the noise sources. The “signal” responses are off scale for the most part.

Electronic noise is that portion of the noise that is independent of the rest of the instrument and is always present. It is not related to whether or not ions are generated and typically is not associated with a particular AMU (Atomic Mass Unit) position. Electronic noise is typically either coherent with a unique frequency content or has high white noise content. With proper preamplifier and electronic system design, the electronic noise can be very small as shown in graph 200. For this particular scan, the electronic noise is only a few counts riding on top of a baseline offset.

Neutral noise is considered as single or multiple detector events that show up in the raw signal. These events are not related to the ions of the compound being detected in that they show up in a pseudorandom fashion across the mass or time range. Typically, these events are small detector responses relative to a typical signal, and come from neutrals formed from the carrier gas such as Helium in a GCMS system. Detector shot noise also has a similar response as neutral noise, and hence can be lumped into the category of neutral noise.

Neutral noise dominates the noise level in a GCMS system because carrier gas molecules outnumber the molecules of the chemical signal. Embodiments of the present invention differentiate between neutral noise and real signals. Neutral noise appears as discrete events, and real signals, when properly sampled, exhibit a peak shape and frequency that conforms to theoretical expectations. For example, a discrete event corresponding to neutral noise has a peak shape that is generally narrower than a signal peak shape with the same spectrometer settings.

Chemical noise is simply a type of “signal” that is unwanted. For purposes of this invention, chemical noise is not considered a “true noise” source since the instrument’s purpose is to detect real ions, even though they are unwanted ions. Therefore, chemical noise is treated as a real signal.

Mass Domain Test

Figure 4:
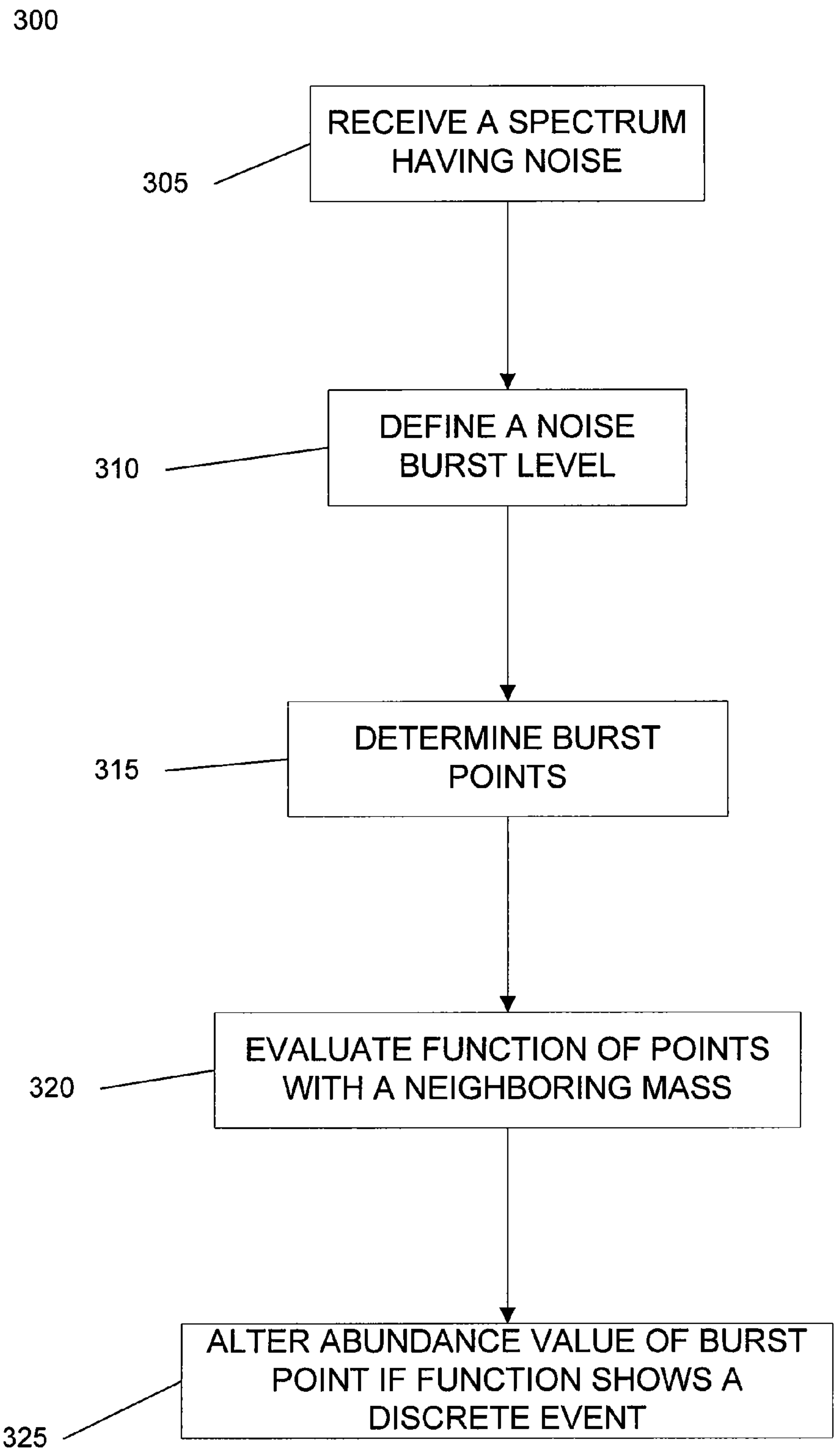
FIG. 4 illustrates a method for reducing noise in the mass domain of spectral data according to an embodiment of the present invention.

FIG. 4 illustrates a method 300 for reducing neutral noise within the mass domain according to an embodiment of the present invention. Method 300 examines a spectrum in an acquisition to identify discrete events and remove them as neutral noise. Real signals are not discrete events. A real signal is surrounded with neighbors separated and distributed in mass with the resolution of the instrument and the sampling interval. For example, a quadrupole instrument is calibrated with a signal peak width of ~0.5 to ~0.6 AMU width at half height.

Accordingly, signals with a gradual decreasing abundance exist on both sides of the center of the peak of a real signal. A neutral noise spike will not have the same distribution across the mass domain. A neutral noise spike will not typically have neighbors with a gradual decreasing abundance on both sides of the center of the peak. Such a single event is referred to as a "burst" in the mass domain. In certain aspects, discrete events may have one or more neighbors; however, the amount of neighbors is less than that of a real signal.

In step 305, a scan of spectral data containing noise is received. A spectral scan contains spectral data points and an abundance value at each spectral point. A spectral point is differentiated from another spectral point based on a physical property (quantity of interest) of the particle or wave being detected, such as mass, wavelength, cross-section, or other suitable spectral property. Typically, a spectral scan is presented as a graph with the spectral property on the horizontal axis, and the abundance on the vertical axis. A spectral scan can include additional spectral properties, which may be presented on additional axes.

Method 300 determines neutral noise based on data occurring within a spectrum or a single scan while other embodiments use multiple scans. A scan is a single pass through the quantity of interest, for example mass or acoustic frequency. Multiple scans may be made over a certain time period, for example over the time period of a chromatography peak.

In step 310, a mass burst (MBURST) level is established to make the determination of discrete events. A goal of a burst level is to isolate the electronic noise and baseline from discrete events coming from the detector of the spectrometer. If the level is lowered, it is possible to start including events from electronic noise. This may be desirable in certain aspects as a lowered level may help eliminate high electronic noise or a shot noise source.

In certain aspects, the burst level is related to the gain setting of the instrument; the higher the gain setting, typically the higher the burst level needs to be. The burst level allows for differentiating between electronic noise and the neutral noise. If the gain is set properly, the neutral noise abundance peaks should be higher than the burst level and the electronic noise peaks should be below the burst level. A burst level also could be a function instead of a constant value for the mass points of a spectrum.

In step 315, burst points are determined. With a proper gain setting, the neutral noise typically appears as "shots", or single events rising out of the baseline. With higher gain systems, the shots can be large. For lower gain systems, the "shots" can be small. To optimize the system, the gain of the detector should be set to produce "shots" that are well above the electronic noise, but not so high to produce tailing into other mass bins.

In step 320, a function of points neighboring a burst point is evaluated to determine whether the burst point represents a discrete event. In one embodiment, an ion with one unit of lower mass or one unit of higher mass or both are used. The unit of mass may be of based on the resolution at which the instrument is being operated or any unit as is desirable for analysis. For example, where the resolution of a mass spectrometer is 0.1 AMU, an immediate neighbor is defined as a mass point that is 0.1 AMU away from the burst point, a secondary neighbor is defined as a mass point that is 0.2 AMU away from the burst point, etc. For other types of spectrometers, a neighbor may be one unit of greater or less wavelength, cross-section, or other suitable physical property to differentiate particles. In certain aspects, the use of neighbors may be extended to masses of more than one unit from the mass of the burst point being analyzed.

In an embodiment utilizing two neighbors, if the function indicates that the burst point corresponds to a discrete event, both neighbors must be below the burst level threshold. For example, where two immediate neighbors are used, the higher mass "AND" lower mass ions have to be below the burst level in the mass domain for the burst point to characterized as a discrete event. In other embodiments, either the higher mass "OR" the lower mass may be below the burst level for the burst point to be characterized as a discrete event. Functions also may use the relative abundance levels of the neighboring points in calculating a weighted average. Functions may also use additional threshold levels along with alternative forms of binary logic.

In step 325, an abundance value of a burst point is altered if the burst point is determined to be a discrete event. In one aspect, the abundance value of the burst point is replaced with an abundance value that correlates to the mass points (neighbors) next to it (e.g. average), or with an abundance value that correlates to a baseline value. The abundance value could also be replaced by a zero value, or replaced by an abundance value from any calculated linear or non-linear function that alters the "noise" abundance value such that it positively improves the instrument's performance by lowering the overall noise of the system without affecting signal.

Figure 5:
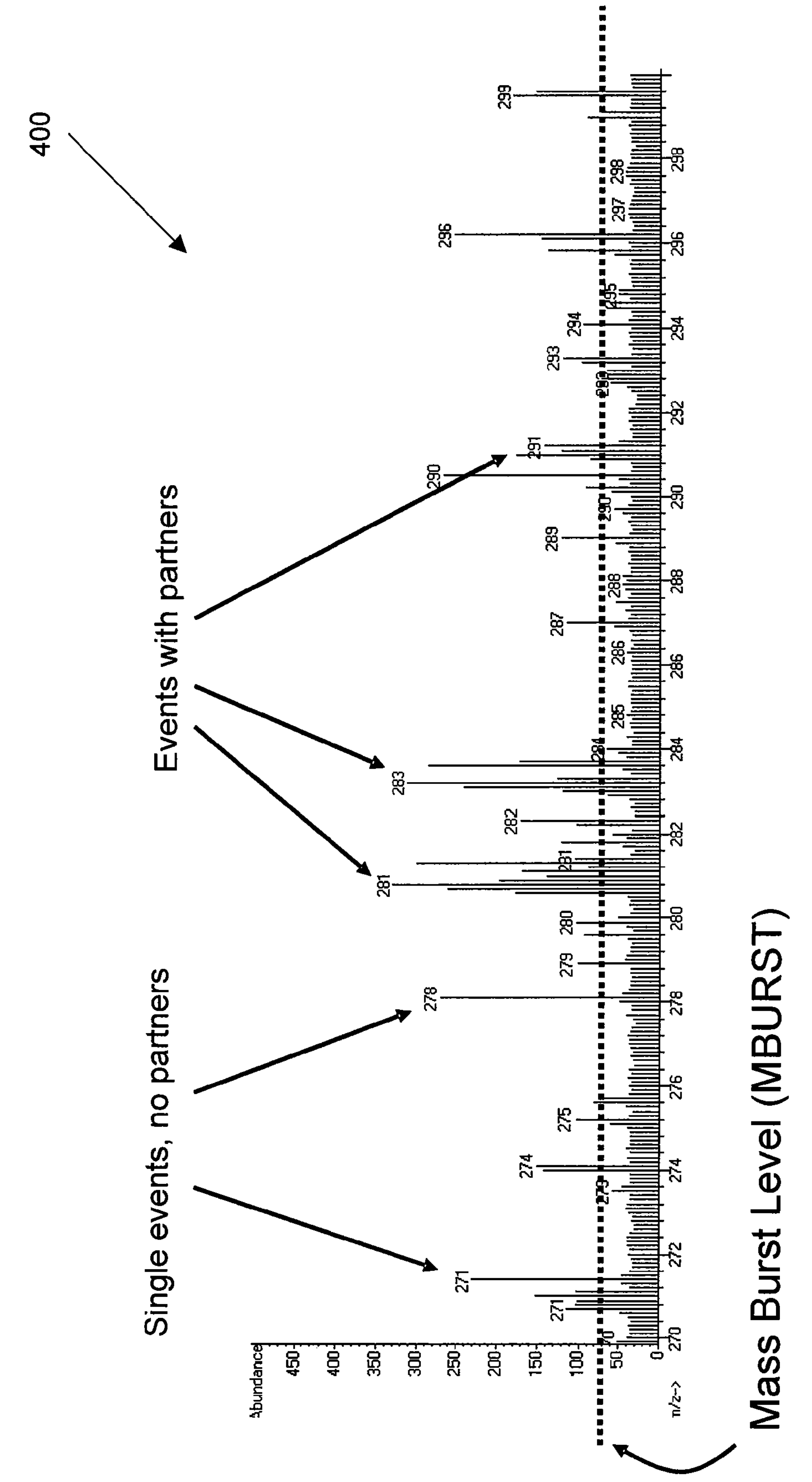
FIG. 5 illustrates a mass spectrum showing single events in the mass domain and events with partners in the mass domain according to an embodiment of the present invention.

FIG. 5 shows a graph 400 of a single spectrum at very low signal levels with a burst level threshold set at about 70 abundance units according to one embodiment of the present invention. Each vertical line corresponds to the abundance of a mass ion with resolution to 0.1 AMU. Single events are shown at approximately 271 and 278 AMU in FIG. 5. Using the teachings of the present invention, the abundance values for these events would be altered or removed, thus effectively removing these events from the spectrum. Non-single events are shown at approximately 281, 283, and 291 AMU. In certain embodiments, for example ones using only two neighbors, these events are considered real signals since they have neighbors above the burst level on either side of peak of the signal.

If method 300 is used for the entire mass range and for all scans in an acquisition, then many discrete events are removed from the spectrum, hence reducing the overall noise level. Items left behind include strong signals, e.g., with large peaks, as well as signals that have peaks of similar magnitude as the neutral noise signal events that have been removed. Because it is now easier to see the low level signals left behind, the overall low level of detection (LLOD) is improved.

Time Domain Test

Figure 6:
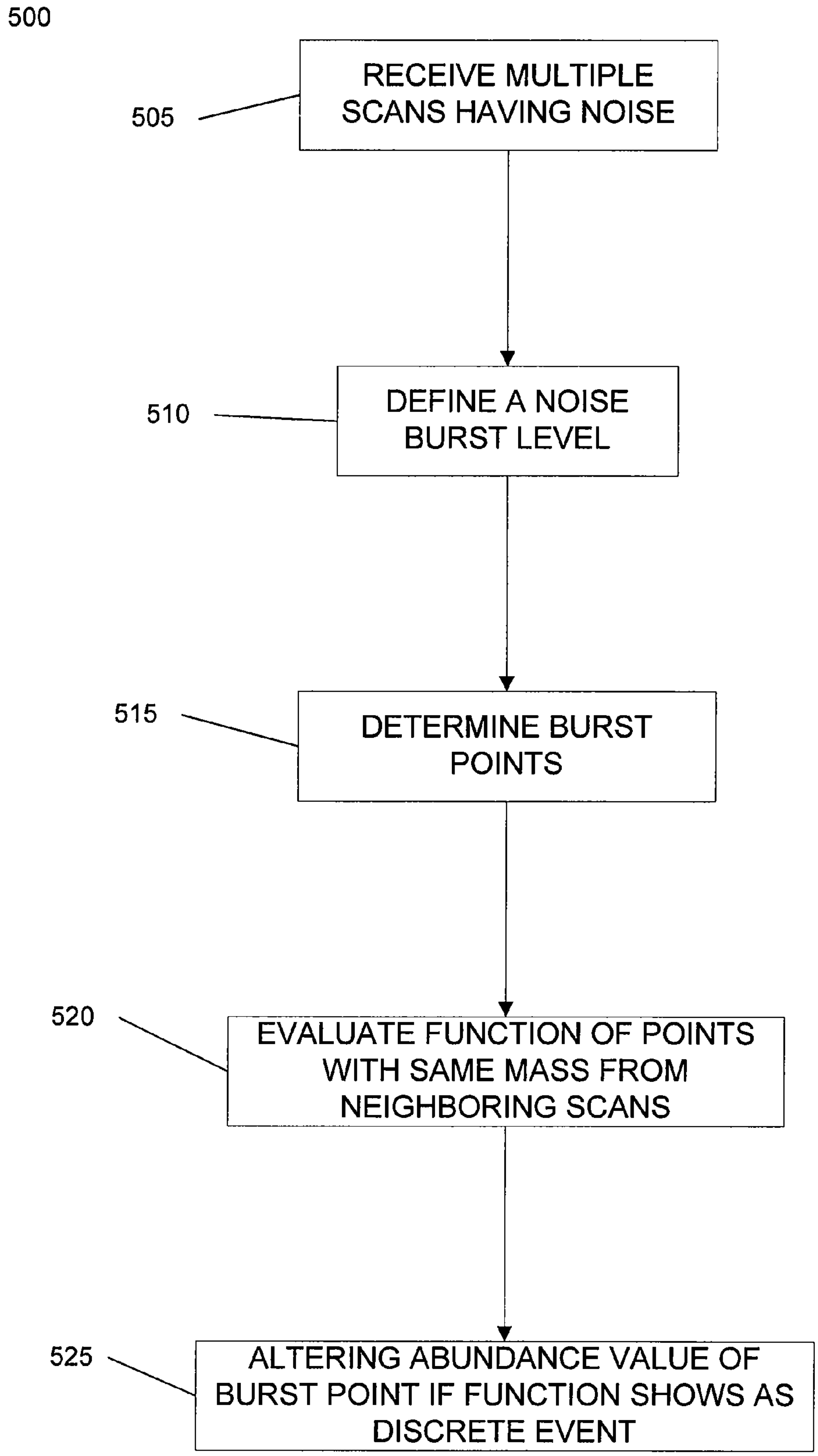
FIG. 6 illustrates a method for reducing noise in the time domain of spectral data according to an embodiment of the present invention.

FIG. 6 illustrates a method 500 for removing neutral noise according to another embodiment of the present invention. While method 300 compares points within the same spectral scan in a mass domain, method 500 compares points within different spectral scans. Thus, method 500 examines mass points in a time domain.

In step 505, multiple scans of spectral data containing noise are received. Each scan occurs during a different time period. In step 510, a time burst (TBURST) level is established to make the determination of single events. In one embodiment, the burst level is the same for all of the scans. In other embodiments, the burst level may vary from one scan to another. In step 515, burst points are determined. In one aspect, if a mass data point, i.e. a point on the horizontal axis of the spectrum, has an abundance value above the burst level, then that mass point is determined to be a "burst" point.

In step 520, a function of points neighboring a burst point is evaluated to determine whether the burst point represents a discrete event. In one embodiment, a neighbor is defined as an ion with the same mass as the burst point, but from a previous or a subsequent scan. In other embodiments, neighbors may be extended to include corresponding mass points from scans beyond the closest scans (in time). The functions used for method 300 may also be used for method 500, such as an "AND" of the neighbors in the two nearest scans. In step 525, an abundance value of a burst point is altered or removed if the function shows the burst point to be a discrete event. The abundance value may be altered by any of the methods previously mentioned or others, e.g., average of surrounding points, set to a baseline value, set to zero, etc.

Figure 7:
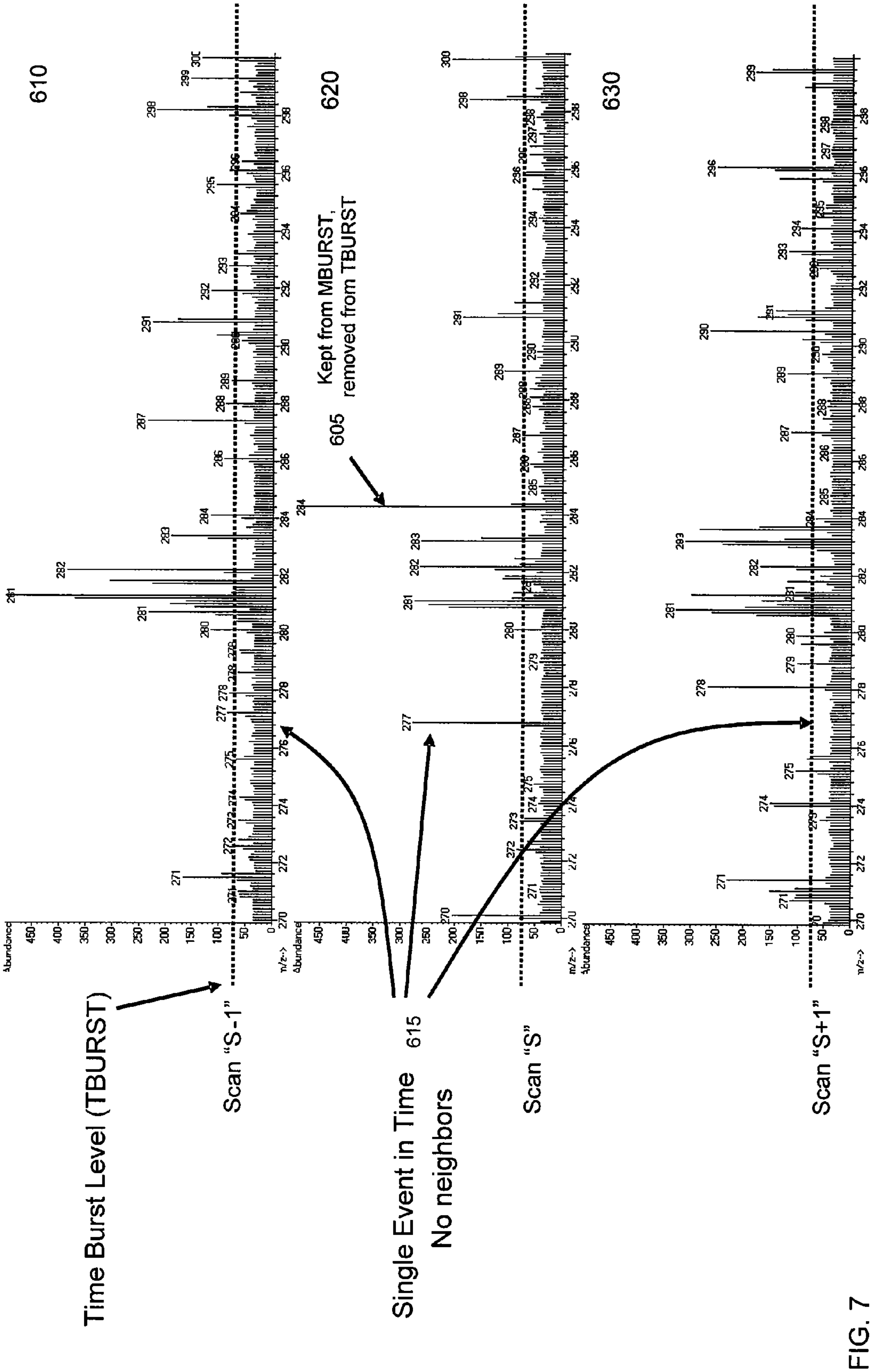
FIG. 7 illustrates a mass spectrum showing single events in the time domain according to an embodiment of the present invention.

FIG. 7 shows three consecutive spectra 610, 620, and 630 that may be analyzed with method 500. Each spectrum with a mass range of 270 to 300 AMU is raw data collected in mass channels (points) with a resolution of 0.1 AMU step size. Spectrum 610 corresponds to a first scan S−1 in time, spectrum 620 corresponds to the next scan S in time, and spectrum 630 corresponds to the last scan S+1 in time. Note that the numbers labeled for each peak correspond to the integer AMU mass that is closest, whereas the actual mass may have a decimal value. For example, the peak labeled 290 in spectra 630 is located at approximately 290.5 AMU.

In one embodiment, mass channels from spectra 620 are analyzed to determine if an event occurs above the time burst level. The burst points from spectra 620 are compared to the abundance levels in that mass channel from the spectral scans 610 and 630. In one aspect, a burst point is effectively removed (e.g., abundance value altered) if the neighboring spectra contain a signal below the burst level. When the spectrums are lined up as shown in FIG. 7, it is easy to see such mass channels having single events. One such event 615 is shown at approximately 276.8 AMU in scan "S" in FIG. 7. Scan "S−1" 610 and Scan "S+1" 630 do not contain an event in their corresponding spectrum so the event in scan "S" 620 is removed according to step 525.

Combined Mass and Time Domain Test

Figure 8:
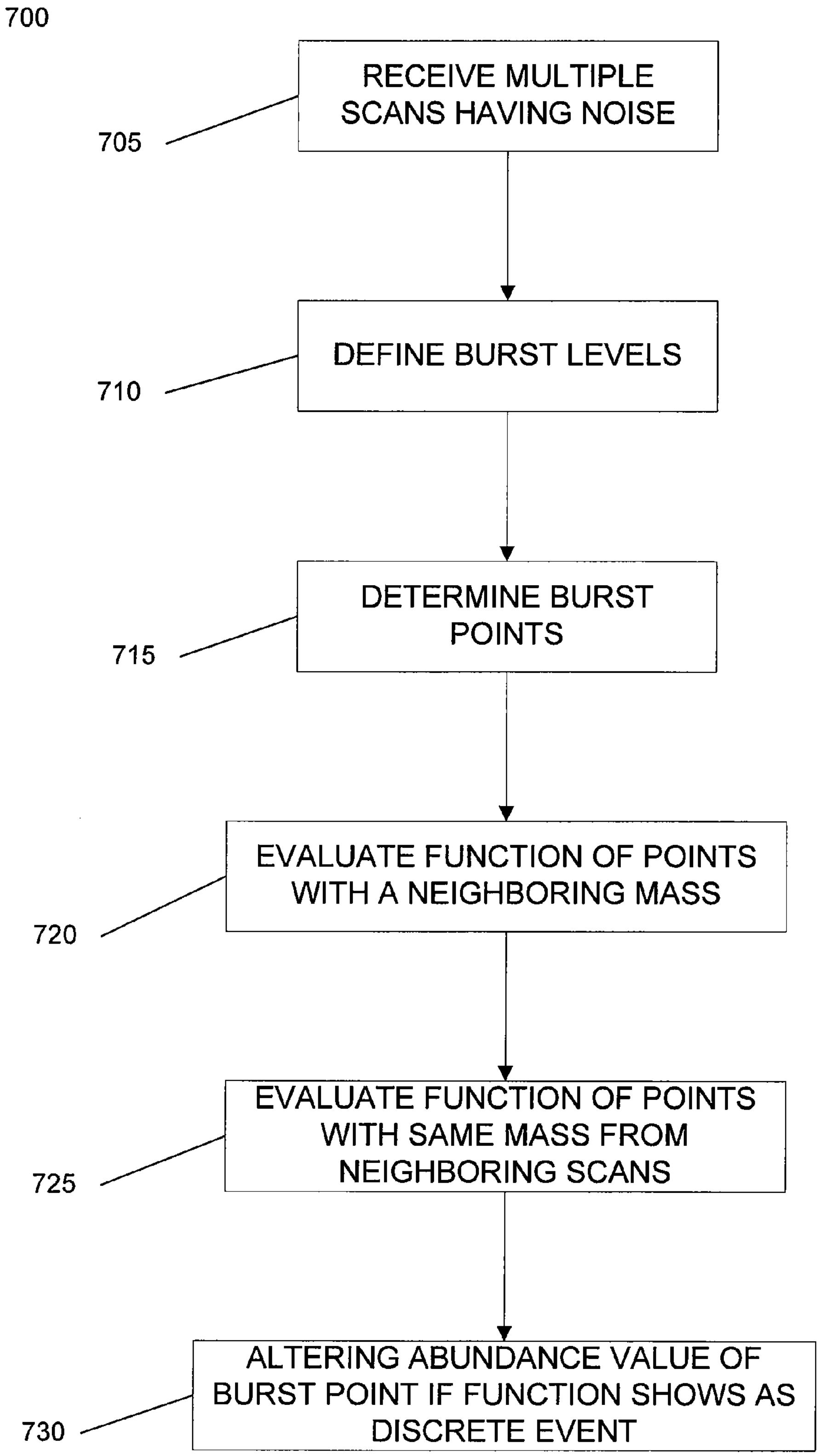
FIG. 8 illustrates a method for reducing noise in the mass and time domain of spectral data according to an embodiment of the present invention.

FIG. 8 illustrates a method 700 for removing neutral noise according to an embodiment of the present invention. Method 700 combines aspects of the mass domain method 300 and the time domain method 500. In step 705, multiple scans of spectral data containing noise are received. In step 710, one or more burst levels are established in order to make the determination of single events. In certain aspects, for example, the time burst level (TBURST) and the mass burst level (MBURST) are the same for a single scan, and in other aspects they differ. In step 715, if a mass channel (data point) has an abundance value above a burst level (TBURST or MBURST), then that mass point is determined to be a "burst" point.

In step 720, for each burst point, a function of points with masses that neighbor the burst point is evaluated to determine whether the burst point represents a discrete event. In step 725, a function of points in scans that neighbor a burst point is evaluated. As in methods 300 and 700, neighbors may be extended to include scans beyond the closest scans. Similarly, the functions used for methods 300 and 500 may also be used for method 700.

In step 730, an abundance value of a burst point is altered if the burst point is determined to be a discrete event. In one embodiment, the abundance value is altered if either the function from the mass domain "OR" the function of the time domain indicates a discrete event. In another embodiment, the functions of both domains (an "AND") must indicate a discrete event. In this step, an "OR" logic function would eliminate the most discrete events. Essentially, these logic operations act as an overall function with inputs from the functions in a specific domain. The overall function may be of any type previously mentioned. In yet another embodiment, an overall function may directly take the input of the neighbors in both domains as is discussed below. That is, the two functions for the different domains may be merged together.

Evaluating neighbors in both the mass and time domains increases the number of discrete events removed from the spectrum and further reduces the noise. For example, FIG. 7 shows a data point 605 in scan "S" 620 at approximately M=284.3 AMU that might not be removed using only a mass domain analysis since a neighbor point has an abundance value above the MBURST level. Using either an "AND" or an "OR" function for scan "S" 620, the MBURST test 300 would not remove the event since its main peak has neighbors at "M+0.1" AMU and "M−0.1" AMU that have abundance values greater than a burst level. However, if a TBURST test 500 is applied, the point would be eliminated since its neighboring scans do not have data in the corresponding mass channel that have an abundance value above the TBURST level In this case, the event at "M+0.1" also might be eliminated by TBURST.

Figure 1A:
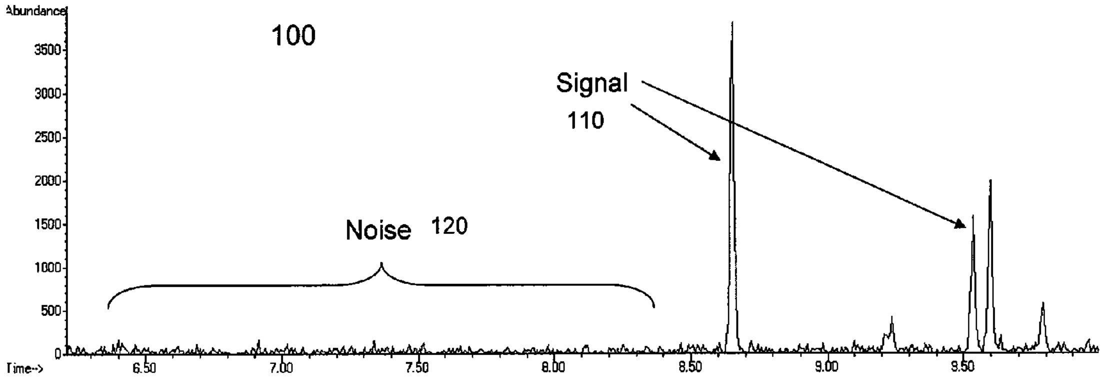
FIGS. 1A and 1B illustrates a chromatogram with standard ion extraction that is improved by embodiments of the present invention.
Figure 1B:
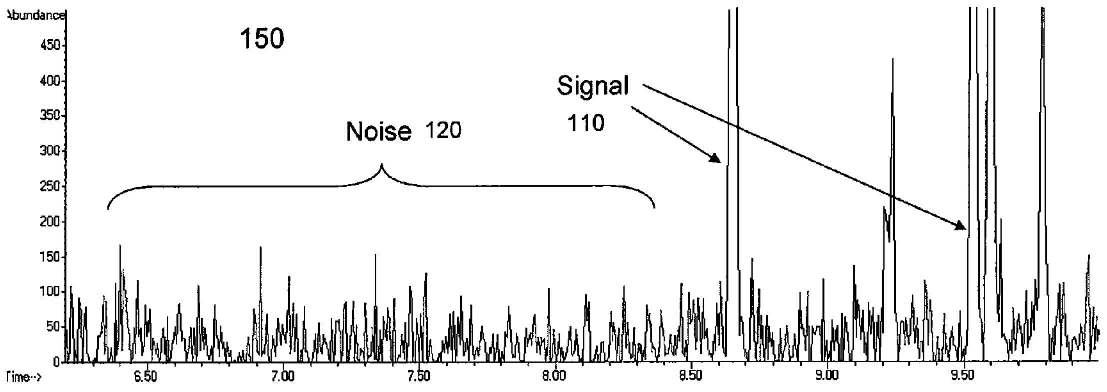
Figure 9A:
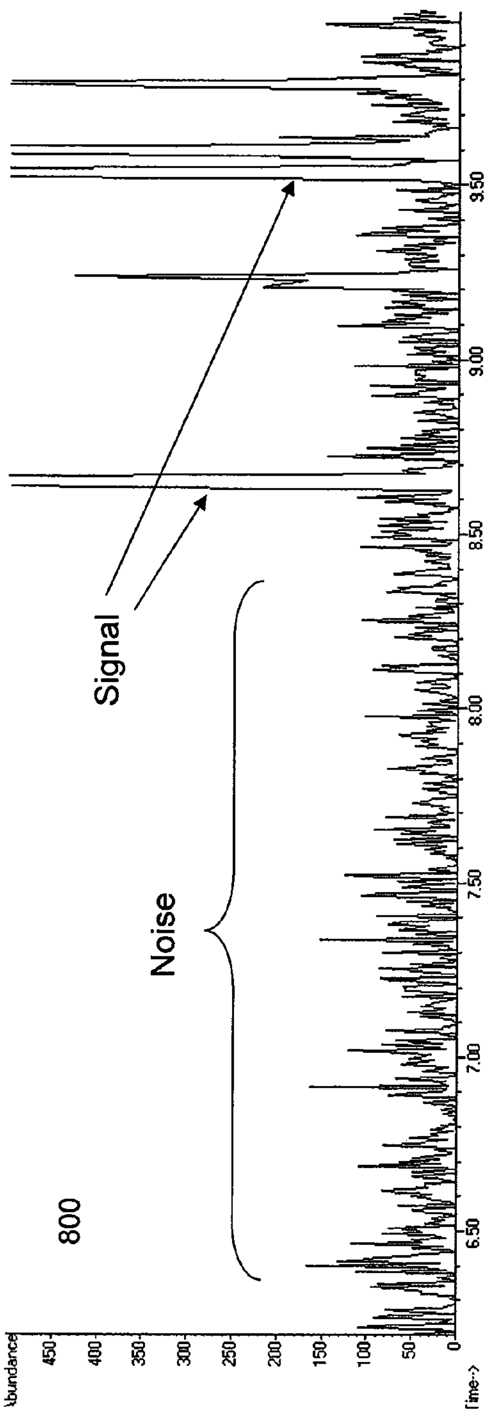
FIG. 9A illustrates a chromatogram with standard ion extraction that is improved by embodiments of the present invention.
Figure 9B:
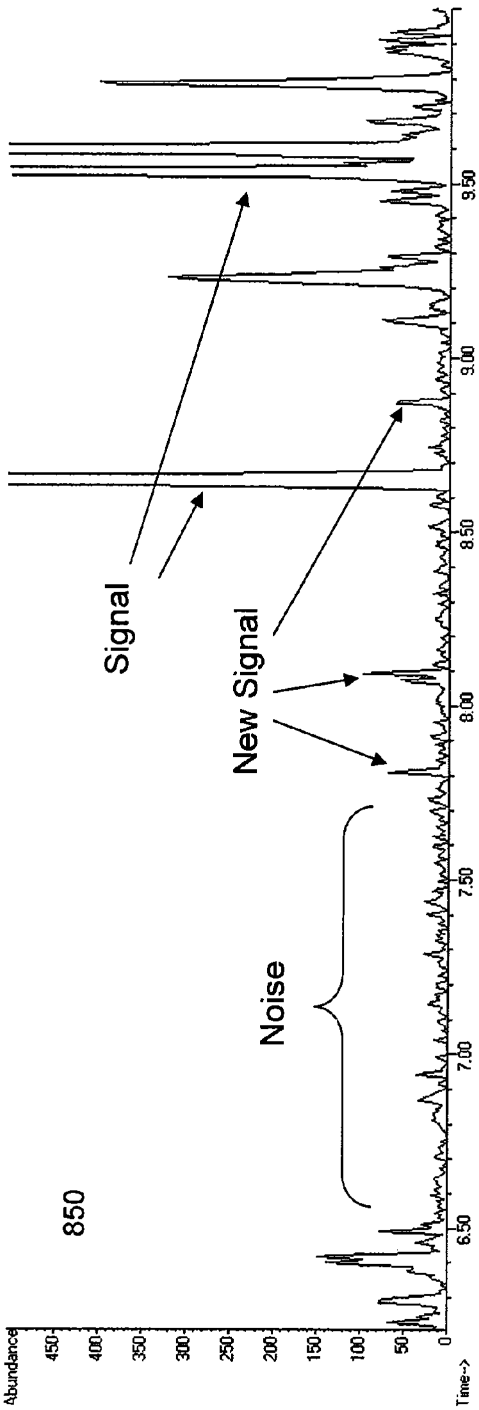
FIG. 9B illustrates an improved chromatogram obtained with embodiments of the present invention.

FIG. 9B shows a graph 850 of a combination of spectra for an entire acquisition of data that has been improved by an embodiment of method 700 of the present invention. To see the improvement of this technique, the data from FIG. 1B is reproduced as graph 800 in FIG. 9A. When an embodiment of the present invention is performed on the data in graph 800, the noise region is drastically reduced as shown in FIG. 9B. The noise region is drastically reduced in height. The average noise is reduced by approximately a factor of 4 and the root mean square (RMS) noise is reduced by approximately a factor of 10. Therefore, depending on the measure of S/N used, aspects of the present invention would provide the instrument used with an improvement of 4 to 10 fold for the data shown.

Also the LLOD (Lower Limit of Detection) is improved as there is greater sensitivity to sensing a signal. Since the noise is now reduced, signals previously hidden in the data start to appear. These previously undiscovered signals are shown as "New Signal" in FIG. 9B. Note that the "New Signal" height was not lowered and the previously known signal levels were also not lowered.

According to certain aspects, various adjustments may be made which would affect the amount of noise removed and signal remaining. Such adjustments include extending the number and or distance of the neighbors used in a comparison, changing the abundance settings of the burst levels, and adjusting the functions used to indicate a discrete event.

As mentioned previously, in certain embodiments more than one neighbor on either side of a burst point, i.e. signal of interest, may be used. Embodiments where only one neighbor on either side of the signal of interest is checked give the highest probability of eliminating a discrete event above burst levels. However, in trying to achieve greater sensitivity for an extremely low noise instrument, these single events become real signal at extremely low concentrations where the ion density is not a continuous stream of ions, but rather a randomly pulsing stream of ions. In this case, it may be appropriate to use more than one neighbor on both sides of the event of interest. This holds true in both the mass domain and the time domain. An example of this could occur in CI or QQQ instrumentation where noise is extremely low.

Figure 10:
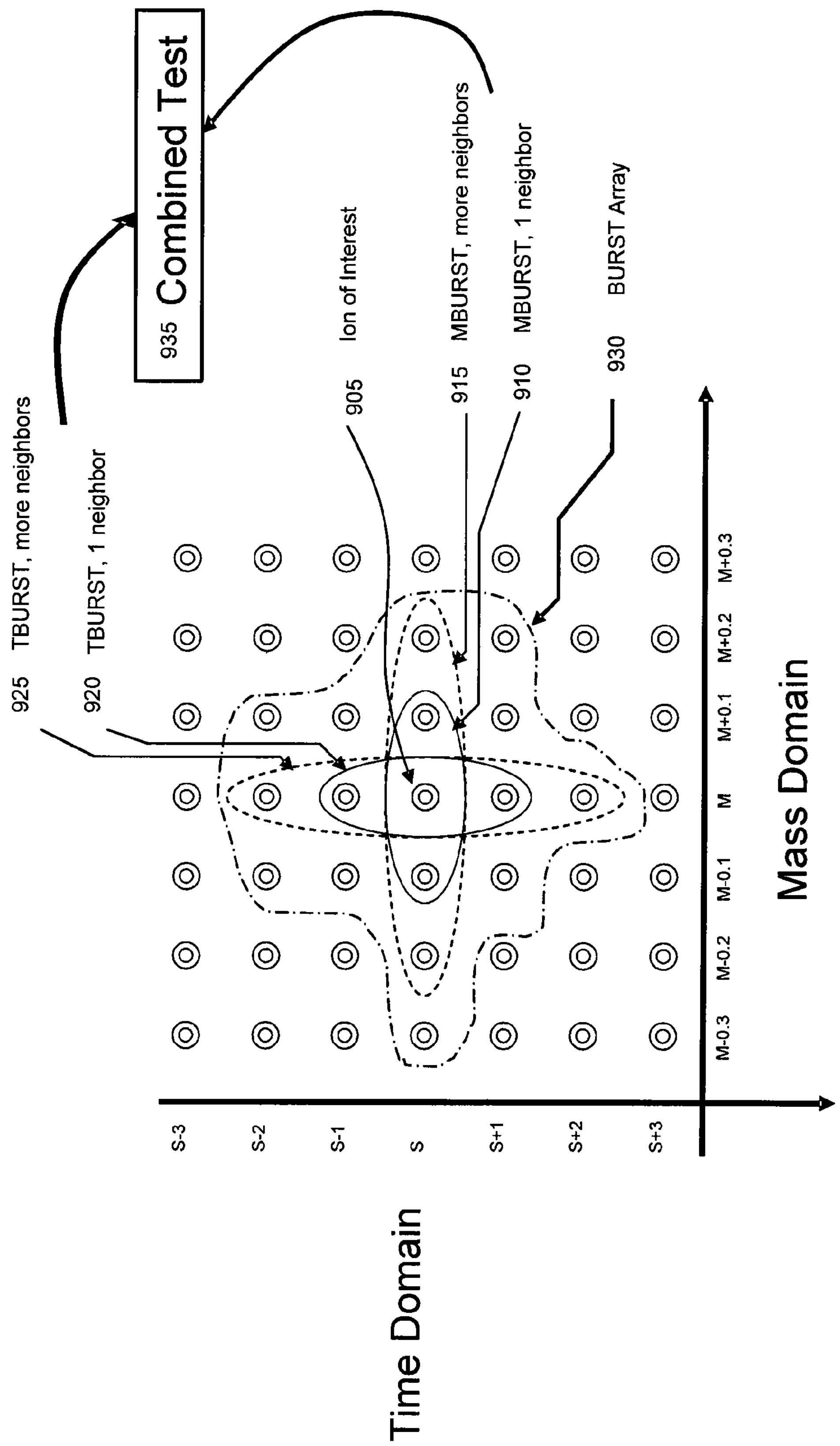
FIG. 10 illustrates different neighboring tests according to embodiments of the present invention.

FIG. 10 is a graphical top down view of a 2 dimensional matrix plot of mass domain and time domain (scans). Each circle represents a location (mass point) in the matrix. For simplicity, height (abundance) of each point is not included. The middle point 905 is described as the "ion of interest" with coordinates (M,S) and all other points are relative to that point.

In one embodiment, an MBURST level and neighbor test function is applied to the data from a single neighbor on either side in the mass domain, as depicted with region 910. In another embodiment, a TBURST level and neighbor test function is applied to the data from a single neighboring scan on either side in the time domain, as depicted with region 920. The different tests may be combined into a combined test function 935.

The MBURST and TBURST levels are adjustable as are the amount of neighbors included in a test. For example, region 915 includes secondary neighbors in the mass domain, and region 925 includes secondary neighbors in the time domain. In certain aspects, the MBURST/TBURST function (s) includes a complex test array, such as array 930 where multiple single scan neighbors are used (MBURST) and neighbors from multiple scans are used (TBURST). This array could include diagonal items in the matrix. This might be useful for a low level signal that dithers a bit around its mass assignment “M”. Thus, a discrete event may be a single shot or an event with some neighbors above a burst level, but still with a sufficient number of neighboring points with relatively small abundance levels.

In certain aspects, where many neighboring points are used, the criteria for removing or altering a burst point may be any function of the neighboring points chosen. The function could be an “AND” of some or all points or an “OR” of all points. The function may also be a percentage of neighboring points that are above or below the burst level or other threshold level. It could also be a function using the abundance values of the neighboring points, for example, the burst point could be removed if the average abundance of neighbor points used is below a certain value. The average could be a weighted average, for example, points further from the burst point in time or mass could be weighted less.

Influence of Operational Settings

In certain aspects, operational settings of the algorithm (e.g., MBURST and TBURST levels) are correlated to operational settings of the instrument to improve performance. Operational settings of the instrument that affect performance of the algorithm include the gain of the ion detector, scan speed and the bandwidth of the preamplifier/A-to-D system, and the electronic noise level. Furthermore, each instrument type may have varying characteristics of these parameters that might require an adjustment to the algorithm. For example, a liquid chromatograph triple quadrupole instrument may have some modes of operation that result in extremely low noise requiring different settings to the algorithm versus a GCMS EI system with high neutral noise from the carrier gas.

As to gain settings, if the gain of a detector is low, the neutral noise spikes may not have much response. This could require a lower burst level to help eliminate these events. On the other hand, if the gain is high such that the neutral noise responses are large, then the burst level may need to be increased. If the levels are set too high, it is possible that real signal might be eliminated. The setting of the burst levels can be fixed or dynamic based on the electronic noise level, the overall tune of the instrument, and the method of acquisition (i.e. scan speed, mass range, detector gain . . . ). The gain settings can also be fixed or dynamic based on the performance of the instrument. For example, the gain setting could be calibrated or auto-tuned for each instrument.

Figure 11A:
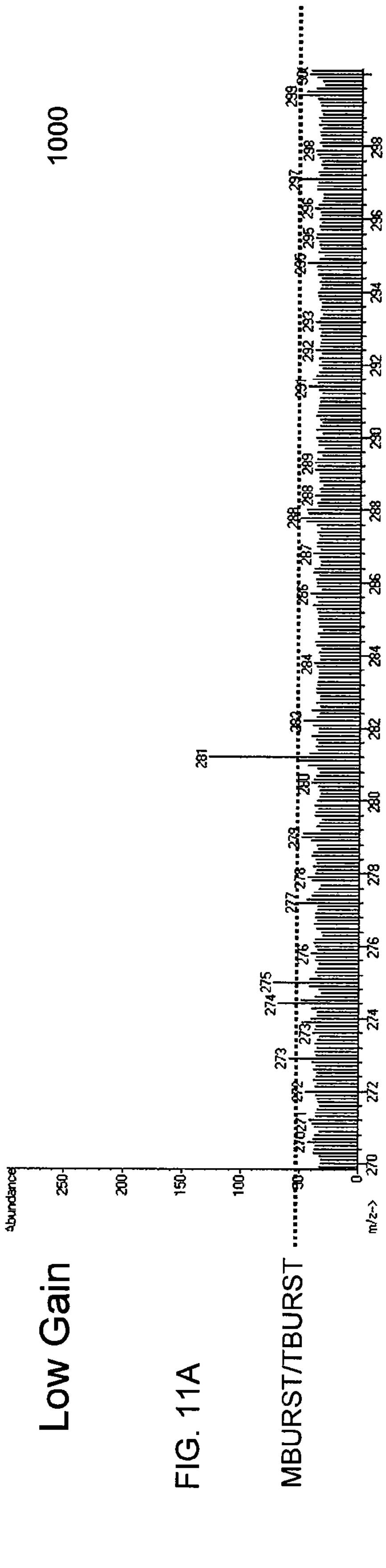
FIGS. 11A and 11B illustrate spectra from a spectrometer instrument with a low gain and a high gain respectively.
Figure 11B:
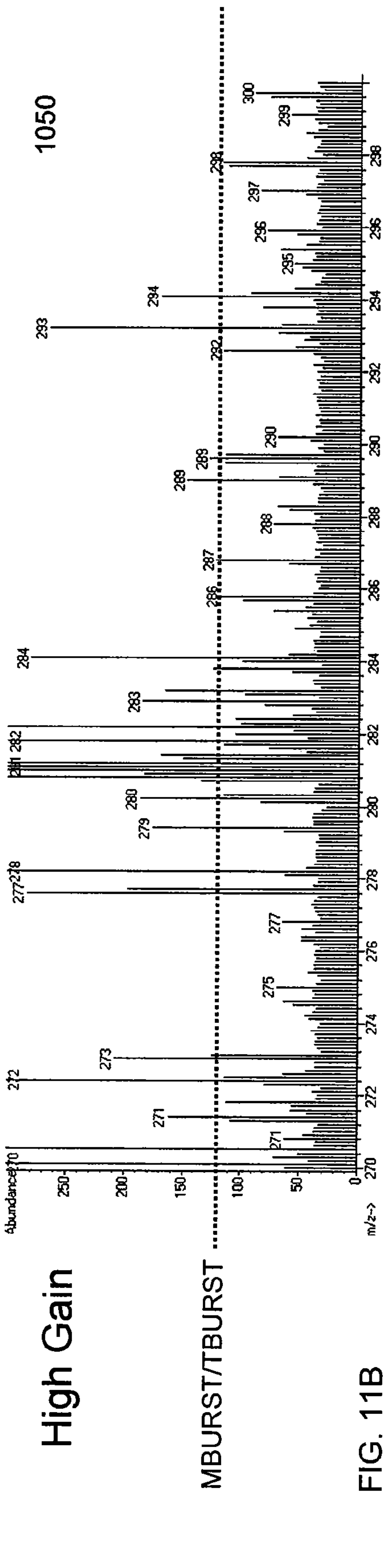

FIG. 11A shows a graph 1000 of a scan with a low gain. Here, the burst level may require a lower setting to be more effective. However, real signal events may have low responses such that the burst tests would not remove those events. FIG. 11B shows a graph 1050 of a scan with high gain and with very large single event responses. In this case, the burst levels might need to be higher, or else some of the discrete events might not get eliminated as they would have neighbors.

Figure 12:
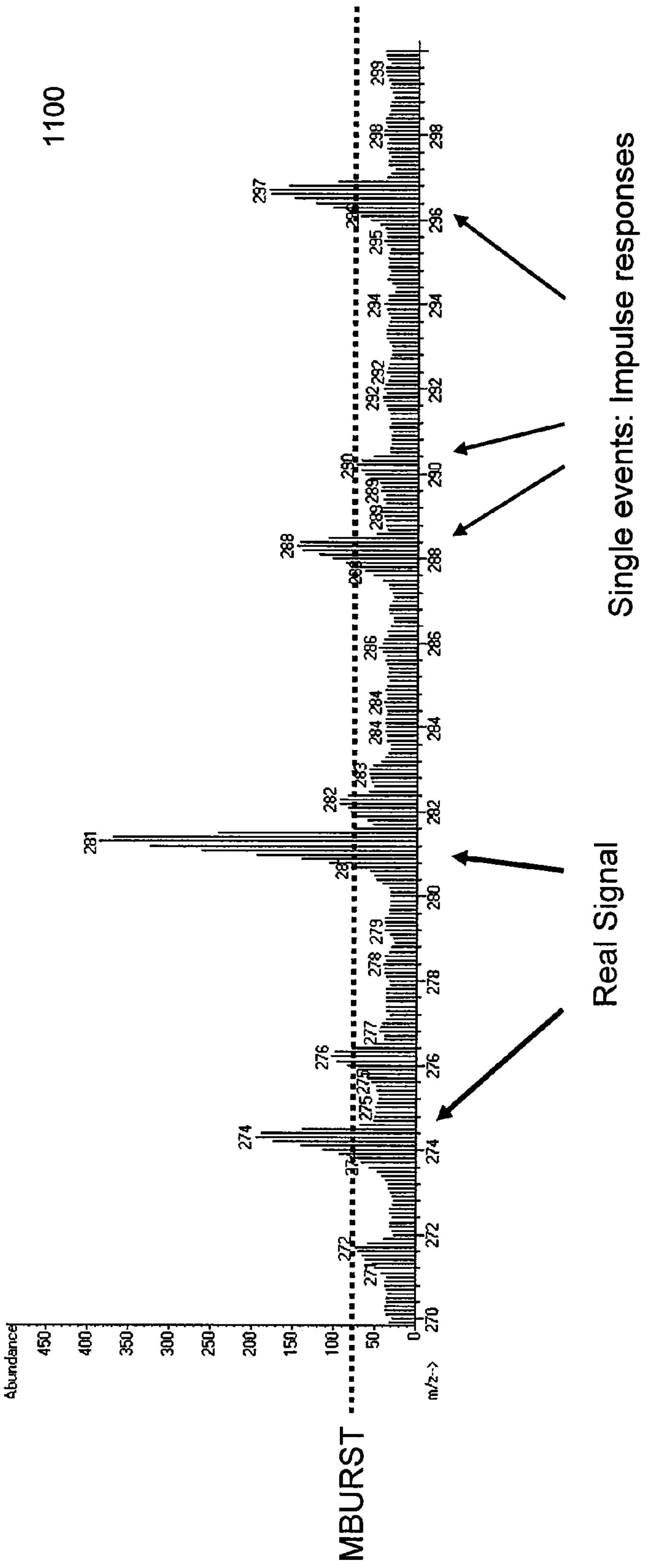
FIG. 12 illustrates a spectrum resulting from very fast scan speed or low bandwidth.

As to scan speed settings (speed across the mass domain), there should be a concise measure of a discrete event where the event is above the burst level and its neighbors are below. However, if the scan speed is not slow enough and/or the bandwidth of the preamplifier and analog-to-digital (A/D) converter system and associated electronics is not broad enough, then the distinct events become impulse responses instead of single events. FIG. 12 shows a graph 1100 of an example of a band limited response while scanning the mass range. For the MBURST level shown, not one of the events will get eliminated. Therefore, the bandwidth of the preamplifier system should match the scan speed so as to make an acceptable distinction in the MBURST test.

Figure 13:
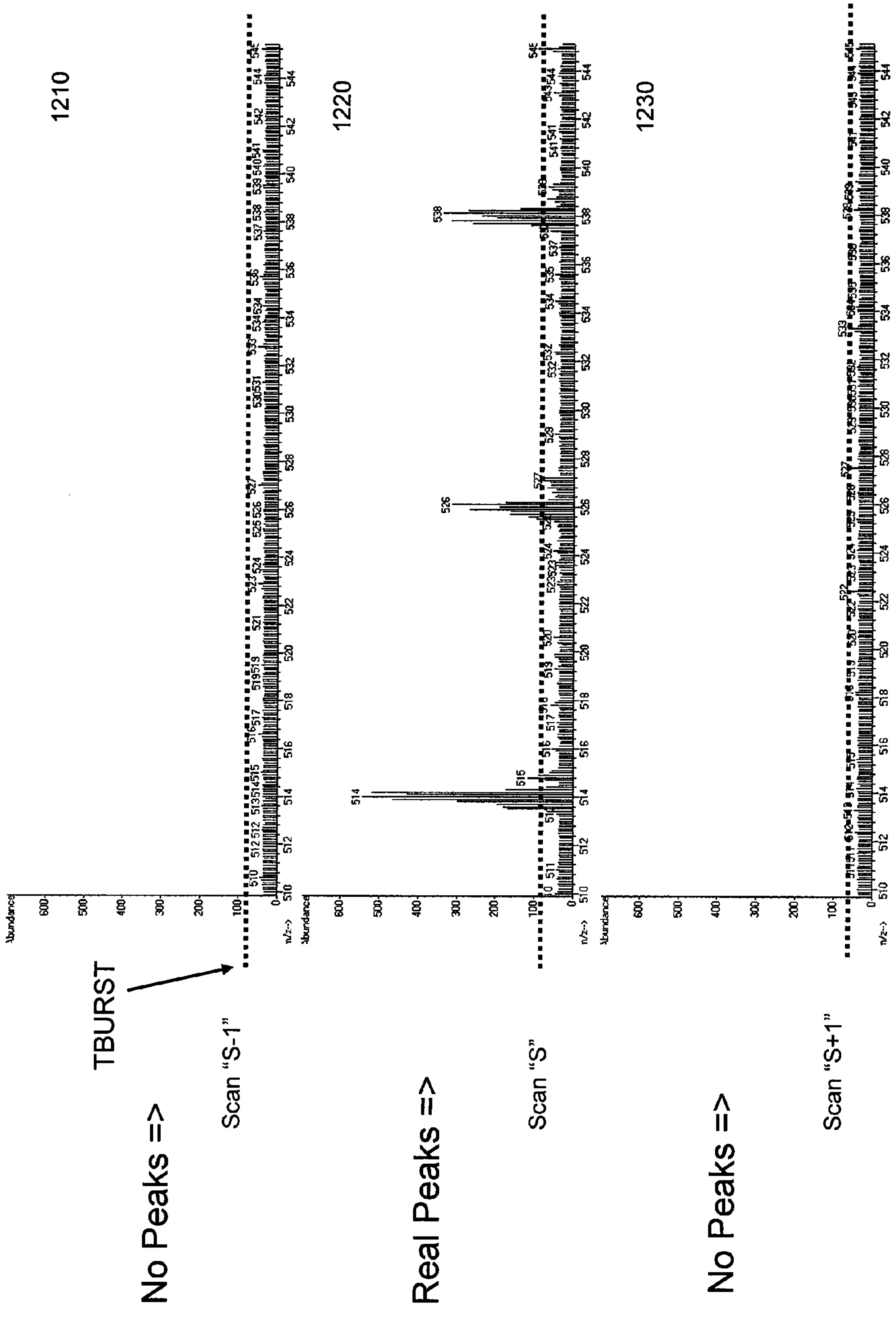
FIG. 13 illustrates spectral scans resulting from very slow scan speeds relative to chromatography peaks.

The chromatographic speed also may affect embodiments of the invention. To sample a chromatographic peak appropriately, there should be several scans across the chromatographic peak of interest. Typically a chromatographic peak will have 4 to 5 scans across it. For the TBURST tests, this may be very important. For example, if the scan speed was so slow as to record a signal in only one scan, the TBURST test may eliminate that signal. FIG. 13 shows an example of an under sampled peak with three consecutive spectra 1210, 1220, and 1230. Spectrum 1210 corresponds to a first scan S−1 in time, spectrum 1220 corresponds to the next scan S in time, and spectrum 1230 corresponds to the last scan S+1 in time. Only the scan S is done during the chromatographic peak. Thus, the signal exists in scan “S” but not in its neighbors. Therefore, the TBURST test would likely eliminate all of the signals. Accordingly, an appropriate scan speed should match the width of a chromatographic peak.

In one embodiment, the noise burst level is calibrated based on a gain setting of the spectrometer. In another embodiment, a gain of the spectrometer is set such that discrete noise events are discernable from electronic noise and signals from the spectrometer. In yet another embodiment, a scan speed of the spectrometer is matched with a bandwidth of a preamplifier and A/D system of the spectrometer. In an embodiment where the spectrometer is a mass spectrometer, a scan speed is regulated relative to a size of a chromatography peak corresponding to an input of the mass spectrometer.

CONCLUSION

One skilled in the art will recognize the many ways that the aforementioned methods and systems may be combined to produce different embodiments of the present invention. For example, steps may be performed in different sequences, and aspects from one embodiment may be used in another embodiment.

Code for controlling a processor or computer system to implement the noise removal methods of the present invention, and other control logic, may be provided to data analysis system 1325 using any means of communicating such logic, e.g., via a computer network, via a keyboard, mouse, or other input device, on a portable medium such as a CD, DVD, or floppy disk, or on a hard-wired medium such as a RAM, ROM, ASIC or other similar device. These means of communicating may also be used to receive any list of parameters.

While the invention has been described by way of example and in terms of the specific embodiments, it is to be understood that the invention is not limited to the disclosed embodiments. To the contrary, it is intended to cover various modifications and similar arrangements, in addition to those discussed above, as would be apparent to those skilled in the art. Therefore, the scope of the appended claims should be accorded the broadest interpretation so as to encompass all such modifications and similar arrangements.

What is claimed is:

1. A computer-implemented method for reducing noise in spectral data from a spectrometer, comprising:

receiving one or more scans of spectral data from a spectrometer, wherein a scan is composed of a plurality of spectral data points each having an abundance value;

defining a noise burst level;

comparing the spectral data points to the noise burst level to identify one or more burst points, wherein a burst point is a spectral point having an abundance value that is greater than the noise burst level;

evaluating a first function of a first set of one or more spectral points neighboring a first burst point to determine if the first burst point is a discrete noise event; and altering the abundance value of the first burst point if the first function indicates that the first burst point is a discrete noise event.

2. The method of claim 1, wherein the noise burst level varies from a spectral point to another spectral point.

3. The method of claim 1, wherein the first function tests whether a specified amount of the spectral points of the first set have an abundance value less than the noise burst level.

4. The method of claim 1, wherein the first function tests whether an average of the spectral points of the first set is above or below a threshold level.

5. The method of claim 1, wherein altering the abundance value of the first burst point comprises replacing the abundance value with an abundance value correlated to an average of the abundances of the neighboring points or correlated to a baseline value.

6. The method of claim 1, further comprising:

evaluating a second function of a second set of one or more spectral points neighboring the first burst point to determine if the first burst point is a discrete noise event; and altering the abundance value of the first burst point if the second function indicates that the first burst point is a discrete noise event.

7. The method of claim 6, wherein all of the spectral points of the first set are from the same scan as the first burst point, and wherein at least one spectral point of the second set is from a different scan and has the same spectral unit as the first burst point.

8. The method of claim 1, wherein the first set of neighboring points consists of the spectral point having one unit lower than the first burst point and the spectral point having one unit greater than the first burst point.

9. The method of claim 1, wherein the first set of spectral points includes spectral points from the same scan as the first burst point and spectral points from other scans.

10. The method of claim 1, further comprising:

calibrating the noise burst level based on a gain setting of the spectrometer.

11. The method of claim 1, further comprising:

setting a gain of the spectrometer such that discrete noise events are discernable from electronic noise and signals from the spectrometer.

12. The method of claim 1, further comprising:

matching a scan speed of the spectrometer with a bandwidth of a preamplifier and A/D system of the spectrometer.

13. The method of claim 1, wherein the spectrometer is a mass spectrometer.

14. The method of claim 13, further comprising:

regulating a scan speed relative to a size of a chromatography peak corresponding to an input of the mass spectrometer.

15. An information storage medium having a plurality of instructions adapted to direct an information processing device to perform an operation for reducing noise in spectral data from a spectrometer, the operation comprising the steps of:

receiving one or more scans of spectral data from a spectrometer, wherein a scan is composed of a plurality of spectral data points each having an abundance value;

defining a noise burst level;

comparing the spectral data points to the noise burst level to identify one or more burst points, wherein a burst point is a spectral point having an abundance value that is greater than the noise burst level;

evaluating a first function of a first set of one or more spectral points neighboring a first burst point to determine if the first burst point is a discrete noise event; and altering the abundance value of the first burst point if the first function indicates that the first burst point is a discrete noise event.

16. The information storage medium of claim 15, wherein the noise burst level varies from a spectral point to another spectral point.

17. The information storage medium of claim 15, wherein the first function tests whether a specified amount of the spectral points of the first set have an abundance value less than the noise burst level.

18. The information storage medium of claim 15, wherein the first function tests whether an average of the spectral points of the first set is above or below a threshold level.

19. The information storage medium of claim 15, wherein altering the abundance value of the first burst point comprises replacing the abundance value with an abundance correlated to an average of the abundances of the neighboring points or correlated to a baseline value.

20. The information storage medium of claim 15, wherein the operation farther comprises:

evaluating a second function of a second set of one or more spectral points neighboring the first burst point to determine if the first burst point is a discrete noise event; and altering the abundance value of the first burst point if the second function indicates that the first burst point is a discrete noise event.

21. The information storage medium of claim 15, wherein the operation further comprises calibrating the noise burst level based on a gain setting of the spectrometer.

22. The information storage medium of claim 15, wherein the operation further comprises setting a gain of the spectrometer such that discrete noise events are discernable from electronic noise and signals from the spectrometer.

23. The information storage medium of claim 15, wherein the operation further comprises matching a scan speed of the spectrometer with a bandwidth of a preamplifier and A/D system of the spectrometer.

24. The information storage medium of claim 15, wherein the spectrometer is a mass spectrometer.

25. The information storage medium of claim 24, wherein the operation further comprises regulating a scan speed relative to a size of a chromatography peak corresponding to an input of the mass spectrometer.

26. A spectrometer system, comprising:

a spectrometer device for producing spectral scans; and a data analysis system including:

means for receiving one or more scans of spectral data produced by the spectrometer, wherein a scan is composed of a plurality of spectral data points each having an abundance value;

logic for defining a noise burst level;

logic for comparing the spectral data points to the noise burst level to identify one or more burst points, wherein a burst point is a spectral point having an abundance value that is greater than the noise burst level;

logic for evaluating a first function of a first set of one or more spectral points neighboring a first burst point to determine if the first burst point is a discrete noise event; and logic for altering the abundance value of the first burst point if the first function indicates that the first burst point is a discrete noise event.

27. The method of claim 1, wherein the first set of one or more spectral points include one or more spectral data points from other scans.

28. The method of claim 1, wherein the first set of one or more spectral points include one or more neighboring data points from the same scan.

29. A computer-implemented method for reducing noise in spectral data from a spectrometer, comprising:

receiving one or more scans of spectra data from a spectrometer, wherein a scan is composed of a plurality of spectra data points each having an abundance value;

defining a noise burst level;

comparing the spectral data points to the noise burst level to identify one or more burst points, wherein a burst point is a spectral point having an abundance value that is greater than the noise burst level;

evaluating a first function of a first set of one or more spectral points neighboring a first burst point to determine if the first burst point is a discrete noise event;

altering the abundance value of the first burst point if the first function indicates that the first burst point is a discrete noise event; and further performing at least one of:

calibrating the noise burst level based on a gain setting of the spectrometer;

setting a gain of the spectrometer such that discrete noise events are discernible from electronic noise and signals from the spectrometer; and matching a scan speed of the spectrometer with a bandwidth of a preamplifier and A/D system of the spectrometer.

* * * * *

UNITED STATES PATENT AND TRADEMARK OFFICE

CERTIFICATE OF CORRECTION

PATENT NO. : 7,519,514 B2
APPLICATION NO. : 11/457751
DATED : April 14, 2009
INVENTOR(S) : Randy Keith Roushall It is certified that error appears in the above-identified patent and that said Letters Patent is hereby corrected as shown below:

In column 12, line 40, in Claim 20, delete “farther” and insert -- further --, therefor.

Signed and Sealed this

Fifteenth Day of September, 2009

David J. Kappos
*Director of the United States Patent and Trademark Office*